(12) United States Patent
Ju

(10) Patent No.: US 10,230,177 B2
(45) Date of Patent: Mar. 12, 2019

(54) ELECTRICAL CONNECTOR

(71) Applicant: LOTES CO., LTD, Keelung (TW)

(72) Inventor: Ted Ju, Keelung (TW)

(73) Assignee: LOTES CO., LTD., Keelung (TW)

(*) Notice: Subject to any disclaimer, the term of this patent is extended or adjusted under 35 U.S.C. 154(b) by 0 days.

(21) Appl. No.: 15/869,532

(22) Filed: Jan. 12, 2018

(65) Prior Publication Data

US 2018/0287269 A1 Oct. 4, 2018

(30) Foreign Application Priority Data

Apr. 1, 2017 (CN) .................... 2017 2 0336302 U

(51) Int. Cl.
| | |
|---|---|
| *H01R 12/00* | (2006.01) |
| *H01R 4/02* | (2006.01) |
| *H01R 12/57* | (2011.01) |
| *H01R 12/70* | (2011.01) |
| *H01R 13/24* | (2006.01) |

(Continued)

(52) U.S. Cl.
CPC .............. *H01R 4/027* (2013.01); *H01R 12/57* (2013.01); *H01R 12/7076* (2013.01); *H01R 12/714* (2013.01); *H01R 13/2407* (2013.01); *H01R 13/2442* (2013.01); *H01R 43/02* (2013.01); *H05K 3/3436* (2013.01); *H01R 12/716* (2013.01); *H01R 43/0221* (2013.01); *H01R 43/16* (2013.01); *H05K 2201/10189* (2013.01);

(Continued)

(58) Field of Classification Search
CPC ........ H01R 4/027; H01R 43/02; H01R 12/57; H01R 12/7076; H01R 13/2407; H01R 12/714; H01R 12/716; H05K 3/3436; H05K 2201/10984; H05K 2201/10189; H05K 2203/041
USPC ..................................................... 439/66, 83
See application file for complete search history.

(56) References Cited

U.S. PATENT DOCUMENTS

| 6,955,545 B1 | 10/2005 | Morana et al. | |
|---|---|---|---|
| 7,128,622 B2 * | 10/2006 | Tsai | H05K 3/3426 439/874 |

(Continued)

FOREIGN PATENT DOCUMENTS

| CN | 2399841 Y | 10/2000 |
|---|---|---|
| CN | 2718822 Y | 8/2005 |

(Continued)

*Primary Examiner* — Abdullah A Riyami
*Assistant Examiner* — Nelson R. Burgos-Guntin
(74) *Attorney, Agent, or Firm* — Locke Lord LLP; Tim Tingkang Xia, Esq.

(57) ABSTRACT

An electrical connector for electrically connecting a chip module to a circuit board, includes an insulation body having multiple receiving holes vertically running through the insulation body, multiple terminals respectively accommodated in the receiving holes, and multiple metal members not in contact with the chip module. Each metal member and the corresponding terminal are accommodated in a same receiving hole. Each metal member and the corresponding terminal clamp and fix a solder ball together, so that the solder ball is stably fixed by the terminal, thereby greatly reducing gaps between terminals on a strip, so that the terminals do not need to be designed by skipping gaps. When the terminals are assembled into a same row of receiving holes, the insertion of the terminals into the same row of receiving holes may be completed in one time.

14 Claims, 6 Drawing Sheets

(51) Int. Cl.
*H01R 12/71* (2011.01)
*H05K 3/34* (2006.01)
*H01R 43/02* (2006.01)
*H01R 43/16* (2006.01)

(52) U.S. Cl.
CPC .............. *H05K 2201/10984* (2013.01); *H05K 2203/041* (2013.01)

(56) References Cited

U.S. PATENT DOCUMENTS

| | | | | |
|---|---|---|---|---|
| 7,791,443 B1* | 9/2010 | Ju | ................ | H01R 12/52 |
| | | | | 336/107 |
| 8,192,206 B1* | 6/2012 | Ju | ................ | H01R 12/57 |
| | | | | 439/66 |
| 8,215,998 B1* | 7/2012 | Ju | ................ | H01R 12/7076 |
| | | | | 439/626 |
| 8,235,734 B2* | 8/2012 | Ju | ................ | H01R 12/57 |
| | | | | 439/83 |
| 8,246,360 B1* | 8/2012 | Tsai | ................ | H01R 12/55 |
| | | | | 439/66 |
| 8,323,038 B2* | 12/2012 | Jin | ................ | H01R 12/714 |
| | | | | 439/66 |
| 8,360,790 B2* | 1/2013 | Ju | ................ | H01R 12/716 |
| | | | | 439/66 |
| 8,608,491 B2* | 12/2013 | Hsu | ................ | H01R 13/24 |
| | | | | 439/66 |
| 8,708,711 B2* | 4/2014 | Horikawa | ................ | H01R 12/52 |
| | | | | 439/66 |
| 8,708,716 B1* | 4/2014 | Ho | ................ | H01R 12/714 |
| | | | | 439/83 |
| 8,894,422 B2* | 11/2014 | Yeh | ................ | H01R 12/57 |
| | | | | 439/83 |
| 8,899,997 B2* | 12/2014 | Zhang | ................ | H01R 12/57 |
| | | | | 439/83 |
| 9,203,169 B1 | 12/2015 | Ju | | |
| 9,917,386 B1* | 3/2018 | Ju | ................ | H01R 12/52 |
| 9,954,312 B1* | 4/2018 | Ju | ................ | H01R 12/707 |
| 2012/0252239 A1* | 10/2012 | Ju | ................ | H01R 12/7082 |
| | | | | 439/157 |
| 2018/0198219 A1* | 7/2018 | Ju | ................ | H01R 12/57 |
| 2018/0205161 A1* | 7/2018 | Ju | ................ | H01R 12/57 |

FOREIGN PATENT DOCUMENTS

| | | |
|---|---|---|
| CN | 2935546 Y | 8/2007 |
| CN | 2938464 Y | 8/2007 |
| CN | 201072835 Y | 6/2008 |
| CN | 201104329 Y | 8/2008 |
| CN | 203056199 U | 7/2013 |
| CN | 203631808 U | 6/2014 |
| CN | 204167537 U | 2/2015 |

* cited by examiner

ELECTRICAL CONNECTOR

CROSS-REFERENCE TO RELATED APPLICATION

This non-provisional application claims priority under 35 U.S.C. § 119(a) on Patent Application No. 201720336302.5 filed in P.R. China on Apr. 1, 2017, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector for electrically connecting a chip module to a circuit board.

BACKGROUND OF THE INVENTION

Chinese patent number 201220644972.0 discloses an electrical connector. The electrical connector includes a main body provided with receiving holes, and terminals accommodated in the receiving holes for connecting a chip module to a circuit board. Each of the terminals includes a base, an extending arm, a soldering portion, and an elastic arm. The soldering portion has two horizontally extending clamping portions to clamp a solder ball.

However, the electrical connector has at least the following disadvantages: extension widths of the two clamping portions are relatively great on a terminal strip. With a development trend of densification of terminals of the electrical connector, gaps between receiving holes become increasingly smaller. The great extension widths of the terminals on the strip make the gaps between the terminals on the strip greater than the gaps between the receiving holes. Therefore, the terminals are often designed by skipping gaps. Consequently, multiple times of assembling are needed when the terminals arranged on the strip are assembled into a same row of receiving holes of an insulation body. For example, terminals at odd-numbered positions, such as the first, the third, and the fifth positions, of the receiving holes in a same row are first inserted, and terminals at even-numbered positions, such as the second, the fourth, and the sixth positions, of the receiving holes in a same row are then inserted. Multiple assembling processes are needed.

Therefore, a heretofore unaddressed need exists in the art to address the aforementioned deficiencies and inadequacies.

SUMMARY OF THE INVENTION

In one aspect, the present invention relates to an electrical connector in which terminals do not need to be designed by skipping gaps. When the terminals are assembled into a same row of receiving holes of an insulation body, an assembling process of inserting the terminals into the same row of receiving holes may be completed at one time.

In certain embodiments, an electrical connector for electrically connecting a chip module includes an insulation body, multiple terminals, and multiple metal members. The insulation body is provided with multiple receiving holes vertically running through the insulation body. The multiple terminals are respectively accommodated in the receiving holes. Each of the terminals includes a base, an elastic arm bending and extending upward from the base, a contact portion disposed at an end of the elastic arm and configured to urge upward against the chip module, and a soldering portion extending downward from the base. The multiple metal members are not in contact with the chip module. Each of the metal members and corresponding one of the terminals are accommodated in a same receiving hole. Each of the metal members is provided with a fixing portion fixed on the base. A connection portion extends from the fixing portion and is located above a solder ball to stop the solder ball from moving upward. A clamping portion bends and extends downward from the connection portion. Each of the clamping portions, together with the corresponding soldering portion, clamps and fixes the solder ball, and a contact area between the clamping portion and the solder ball and a contact area between the soldering portion and the solder ball are at least partially located below a horizontal central surface of the solder ball.

In certain embodiments, the fixing portion is in a shape of a vertical flat plate, the base is provided with a vertical surface, and the fixing portion is soldered to the vertical surface using a laser.

In certain embodiments, the connection portion is formed by bending and horizontally extending from a lower end of the fixing portion, and the clamping portion is formed by bending downward and vertically extending downward from the connection portion.

In certain embodiments, the soldering portion is located on one side of the solder ball and is arc-shaped along a horizontal direction, and the clamping portion is located on an opposite other side of the solder ball.

In certain embodiments, the elastic arm includes a first arm formed by bending and extending upward from the base toward a direction away from the vertical surface of the base, and a second arm formed by bending and extending backward from the first arm across the vertical surface of the base; the contact portion is arc-shaped and extends from an end of the second arm, and the first arm and the clamping portion are located on one side of the vertical surface of the base.

In certain embodiments, a top of the metal member is lower than a joint of the elastic arm and the base.

In another aspect, the present invention relates to an electrical connector for electrically connecting a chip module. The electrical connector includes an insulation body, multiple terminals, and multiple metal members. The insulation body is provided with multiple receiving holes vertically running through the insulation body. The multiple terminals are respectively accommodated in the receiving holes and configured to contact the chip module. Each of the terminals includes a soldering portion. The multiple metal members are not in contact with the chip module. Each of the metal members is correspondingly fixed on a corresponding one of the terminals, and is accommodated in a same one of the receiving holes with the corresponding one of the terminals. Each of the metal members is provided with a clamping portion. Each of the clamping portions, together with the corresponding soldering portion, clamps and fixes a solder ball. A contact area between the clamping portion and the solder ball and a contact area between the soldering portion and the solder ball are at least partially located below a horizontal central surface of the solder ball.

In certain embodiments, each of the terminals includes a base, the soldering portion is formed by extending downward from the base, a first arm is formed by bending and extending upward from the base toward a direction away from the vertical surface of the base, a second arm is formed by bending and extending backward from the first arm across the vertical surface of the base, and a contact portion is arc-shaped and extending from an end of the second arm to urge upward against the chip module. The first arm and the clamping portion are located on one side of the vertical surface of the base.

In certain embodiments, the metal member has a fixing portion in a shape of a vertical flat plate, the terminal is provided with a vertical surface, and the fixing portion is soldered to the vertical surface using a laser.

In certain embodiments, a connection portion is formed by bending and horizontally extending from a lower end of the fixing portion, and the clamping portion is formed by bending downward and vertically extending downward from the connection portion.

In certain embodiments, the metal member is made of a metal material that cannot be stably soldered to the solder ball.

In certain embodiments, the metal member is made of a stainless steel material.

In certain embodiments, the metal member has a connection portion located above the solder ball to stop the solder ball from moving upward, and the clamping portion is formed by bending and extending downward from the connection portion.

As compared with the related art, certain embodiments of the present invention have the following beneficial advantages: a metal member and a terminal are fixed and then clamp a solder ball together, so that the solder ball is stably fixed by the terminal, thereby greatly reducing gaps between the terminals on a strip, so that the terminals do not need to be designed by skipping gaps. When the terminals are assembled into a same row of receiving holes of an insulation body, an assembling process of inserting the terminals into the same row of receiving holes may be completed in one time.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
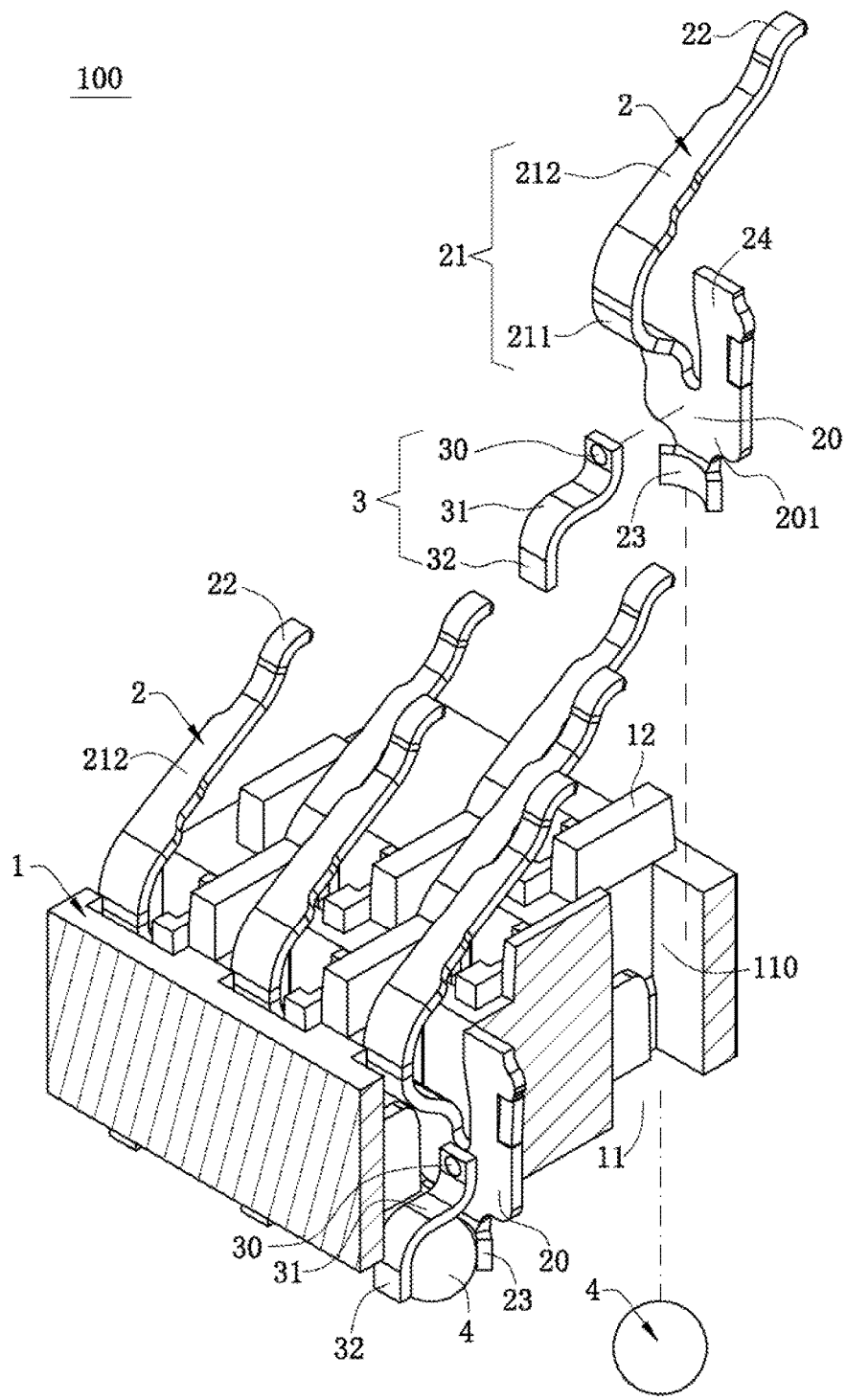
FIG. 1 is a schematic three-dimensional sectional view of an electrical connector according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to an assembly of a cable connection apparatus and an electrical connector.

As shown in FIGS. 1-6, an electrical connector 100 according to certain embodiments of the present invention is used to electrically connect a chip module 200 to a circuit board 300. The electrical connector 100 includes an insulation body 1, multiple terminals 2, and multiple metal members 3. The insulation body 1 is provided with multiple receiving holes 11 vertically running through the insulation body 1. The multiple terminals 2 are respectively accommodated in the receiving holes 11. The multiple metal members 3 are not in contact with the chip module 200. Each of the metal members 3 and corresponding one of the terminals 2 are accommodated in a same receiving hole 11, and the metal members 3, together with the corresponding terminal 2, clamps and fixes a solder ball 4.

Figure 6:
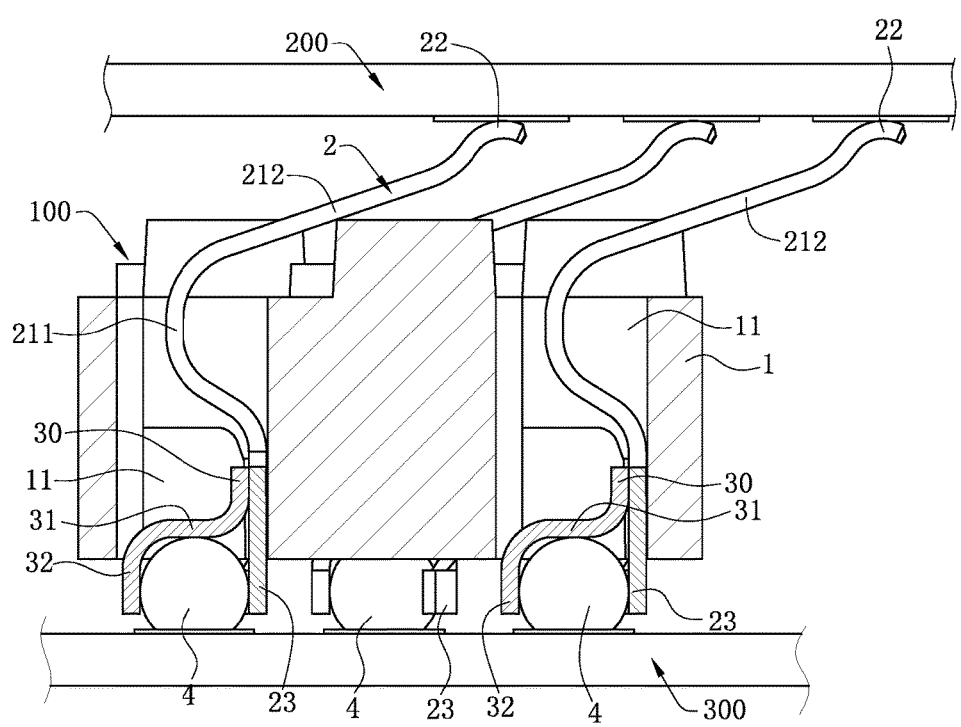
FIG. 6 is a local sectional view when an electrical connector is located between a chip module and a circuit board and the chip module is pressed according to one embodiment of the present invention.

As shown in FIGS. 1 and 6, each of the receiving holes 11 is provided with a retaining slot 110. The insulation body 1 has an upper surface and a lower surface that are opposite to each other. Multiple protruding blocks 12 protrude upward from the upper surface to support the chip module 200.

Figure 2:
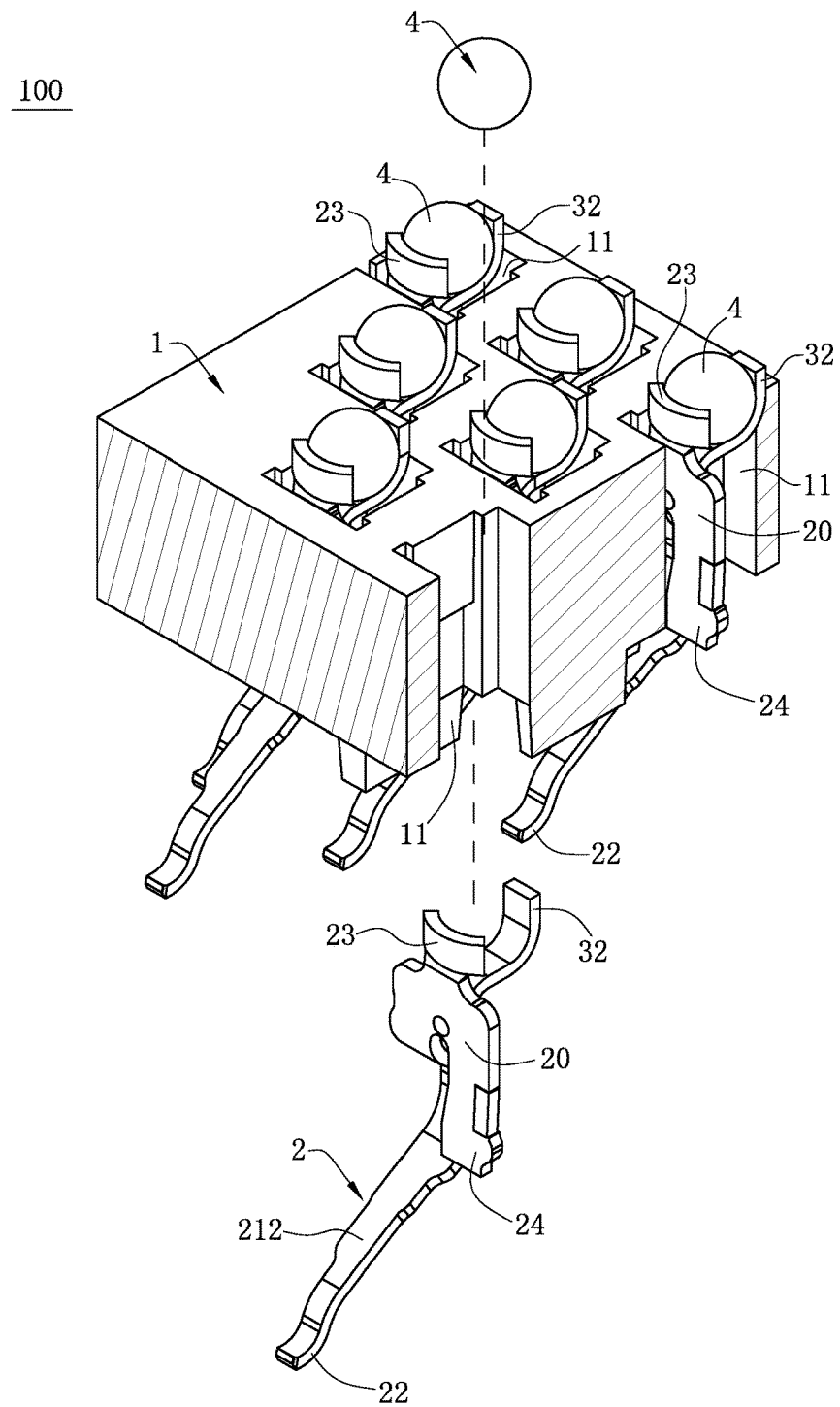
FIG. 2 is a schematic three-dimensional sectional view of an electrical connector from another perspective according to one embodiment of the present invention from another view angle.
Figure 3:
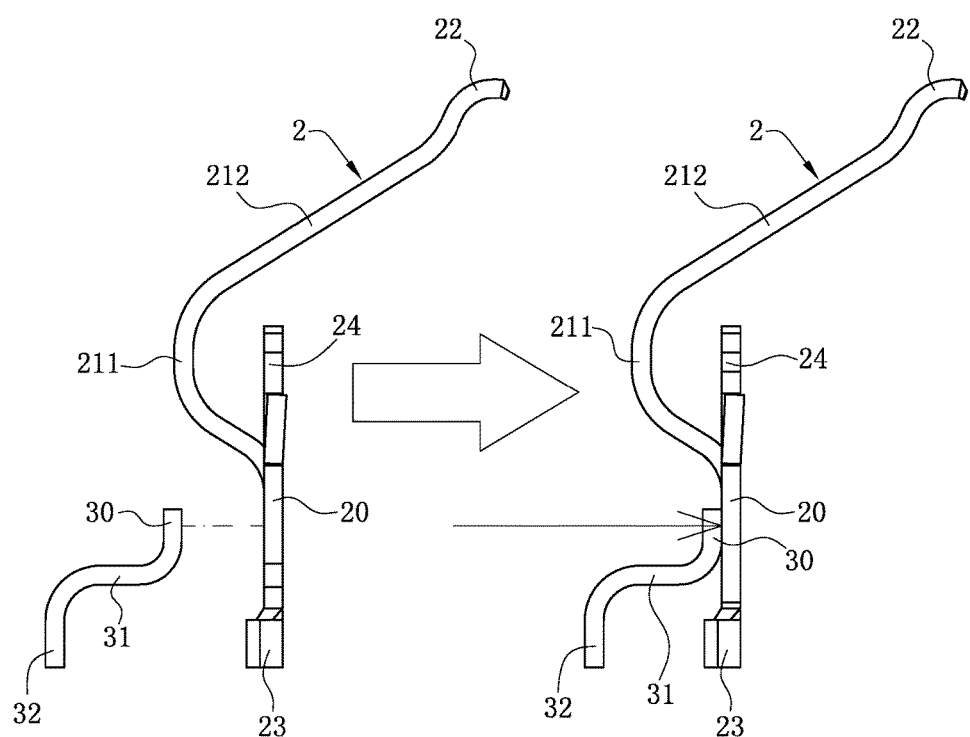
FIG. 3 is a schematic diagram of soldering and fixing a terminal and a metal member of an electrical connector according to one embodiment of the present invention.
Figure 4:
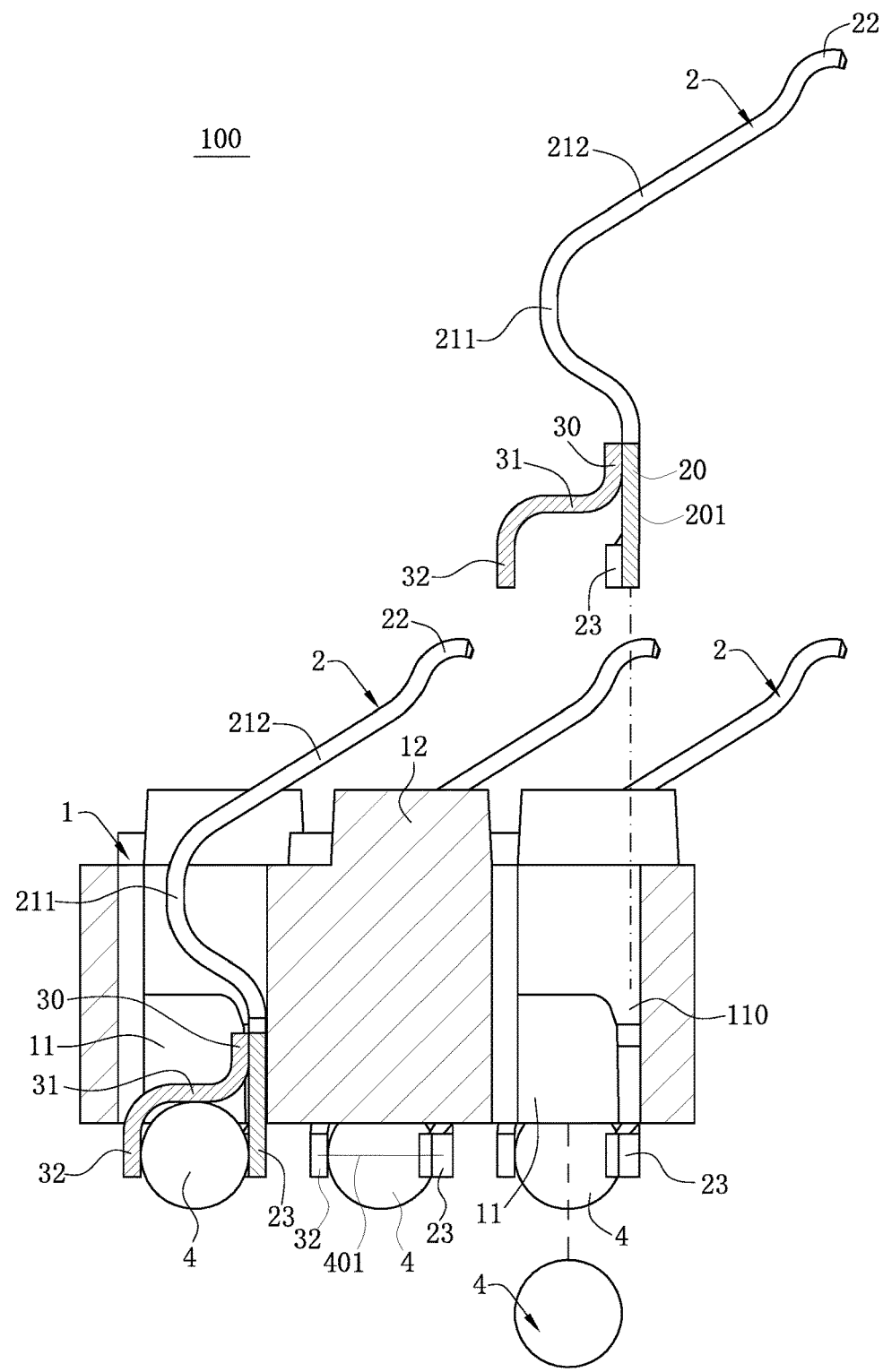
FIG. 4 is a local planar sectional view of an electrical connector according to one embodiment of the present invention.
Figure 5:
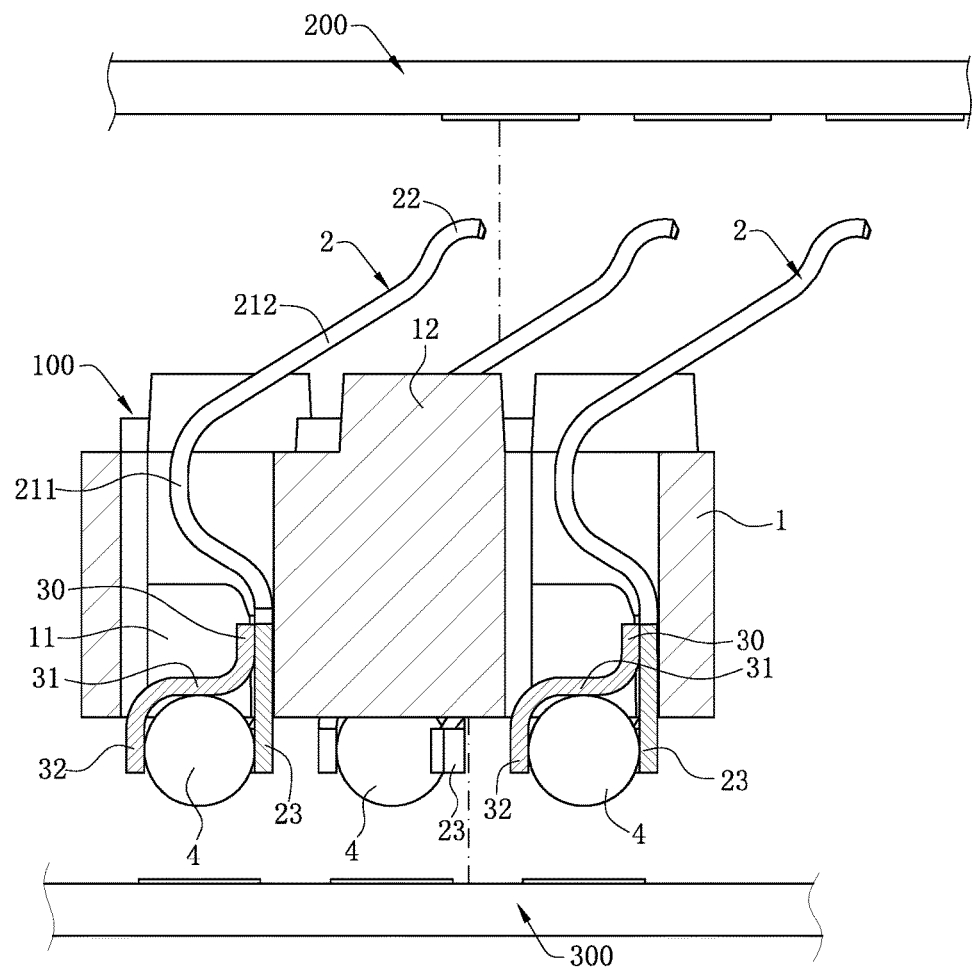
FIG. 5 is a local sectional view when an electrical connector is located between a chip module and a circuit board and the chip module is not pressed according to one embodiment of the present invention.

As shown in FIGS. 1, 2 and 4, each of the terminals 2 has a base 20 retained in the retaining slot 110, and the base 20 has a vertical surface 201. An elastic arm 21 bends and extends upward from one side of the base 20. The elastic arm 21 includes a first arm 211 formed by bending and extending upward from the base 20 toward a direction away from the vertical surface 201 of the base 20, and a second arm 212 formed by bending and extending backward from the first arm 211 across the vertical surface 201 of the base 20. A contact portion 22 is arc-shaped and extends from an end of the second arm 212 to urge upward against the chip module 200. A material connection portion 24 in a flat plate shape extends upward from the other side of the base 20 to connect a strip (not shown). A gap exists between the material connection portion 24 and the elastic arm 21. A soldering portion 23 extends downward from the base 20. The soldering portion 23 is located on one side of the solder ball 4 and is arc-shaped in a horizontal direction. A part of a contact area between the soldering portion 23 and the solder ball 4 is located above a horizontal central surface 401 of the solder ball 4, and the other part of the contact area is located below the horizontal central surface 401 of the solder ball 4. The lower surface of the insulation body 1 is exposed on the soldering portion 23.

As shown in FIGS. 3-6, the metal member 3 is made of a metal material that cannot be stably soldered to the solder ball 4. For example, the metal member 3 is made of a stainless steel material, and a surface of the metal member 3 is not plated with a plating layer that can be soldered. In other embodiments, the metal member 3 may also be made of a metal material that can be stably soldered to the solder ball 4, for example, the metal member 3 is made of a copper material, and a surface of the metal material is not plated with a plating layer that can be soldered. A top of the metal member 3 is lower than a joint between the elastic arm 21 and the base 20. The metal member 3 includes a fixing portion 30 in a shape of a vertical flat plate, and the fixing portion 30 is soldered to the vertical surface 201 of the base 20 using a laser. In other embodiments, the terminal 2 and the metal member 3 may also be fixed using a fastener or another fixing method. A connection portion 31 is formed by bending and horizontally extending from a lower end of the fixing portion 30, and the connection portion 31 is located above the solder ball 4 to stop the solder ball 4 from moving upward. A clamping portion 32 is formed by bending downward and vertically extending downward from the connection portion 31. The soldering portion 23 is located on one side of the solder ball 4, and the clamping portion 32 is located on the opposite other side of the solder ball 4. The clamping portion 32, together with the soldering portion 23, clamps the solder ball 4. A contact area between the clamping portion 32 and the solder ball 4 is located on the horizontal central surface 401 of the solder ball 4. In other embodiments, the contact area between the clamping portion 32 and the solder ball 4 may also be located below the horizontal central surface 401 of the solder ball 4. The clamping portion 32 and the first arm 211 are located on a same side of the vertical surface 201. The clamping portion 32 is exposed on the lower surface of the insulation body 1, and a bottom surface of the clamping portion 32 and a bottom surface of the soldering portion 23 are located on a same horizontal surface.

In summary, the electrical connector 100 according to certain embodiments of the present invention, among other things, has the following beneficial advantages:

(1) The metal member 3 and the terminal 2 are fixed and then clamp a solder ball 4 together, so that the solder ball 4 is stably fixed by the terminal 2, thereby greatly reducing gaps between terminals 2 on a strip, so that the terminals 2 do not need to be designed by skipping gaps. When the terminals 2 are assembled into a same row of receiving holes 11 of the insulation body 1, an assembling process of inserting the terminals 2 into the same row of receiving holes 11 may be completed at one time.

(2) The soldering portion 23 is located on one side of the solder ball 4 and is arc-shaped along a horizontal direction, thereby increasing a contact area between the soldering portion 23 and the solder ball 4, and ensuring stable retaining of the terminal 2 to the solder ball 4.

(3) The clamping portion 32 is made of a stainless steel material, so that costs of the electrical connector 100 are reduced as compared with using a copper material.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module, comprising:

an insulation body, provided with a plurality of receiving holes vertically running through the insulation body;

a plurality of terminals, respectively accommodated in the receiving holes, wherein each of the terminals comprises a base, an elastic arm bending and extending upward from the base, a contact portion disposed at an end of the elastic arm and configured to urge upward against the chip module, and a soldering portion extending downward from the base; and a plurality of metal members, not in contact with the chip module, wherein each of the metal members is provided independently from the terminals, wherein each of the metal members and corresponding one of the terminals are accommodated in a same one of the receiving holes;

wherein each of the metal members has a fixing portion fixed on the base, a connection portion extending from the fixing portion and located above corresponding one of solder balls to stop the solder ball from moving upward, and a clamping portion bending and extending downward from the connection portion; and wherein each of the clamping portions, together with corresponding one of the soldering portions, clamps and fixes corresponding one of the solder balls, and a contact area between the clamping portion and the solder ball and a contact area between the soldering portion and the solder ball are at least partially located below a horizontal central surface of the solder ball.

2. The electrical connector of claim 1, wherein the fixing portion is in a shape of a vertical flat plate, the base is provided with a vertical surface, and the fixing portion is attached and soldered to the vertical surface using a laser.

3. The electrical connector of claim 1, wherein the connection portion is formed by bending and horizontally extending from a lower end of the fixing portion, and the clamping portion is formed by bending downward and vertically extending downward from the connection portion.

4. The electrical connector of claim 1, wherein the soldering portion is located on one side of the solder ball and is arc-shaped along a horizontal direction, and the clamping portion is located on an opposite other side of the solder ball.

5. The electrical connector of claim 1, wherein the elastic arm comprises a first arm formed by bending and extending upward from the base toward a direction away from a vertical surface of the base, and a second arm formed by bending and extending backward from the first arm across the vertical surface of the base, the contact portion is arc-shaped and extends from an end of the second arm, and the first arm and the clamping portion are located on one side of the vertical surface of the base.

6. The electrical connector of claim 1, wherein a top of the metal member is lower than a joint between the elastic arm and the base.

7. An electrical connector for electrically connecting a chip module, comprising:

an insulation body, provided with a plurality of receiving holes vertically running through the insulation body;

a plurality of terminals, respectively accommodated in the receiving holes and configured to contact the chip module, wherein each of the terminals comprises a base and a soldering portion; and a plurality of metal members, not in contact with the chip module, wherein each of the metal members is provided independently from the terminals, wherein each of the metal members is correspondingly fixed on corresponding one of the terminals, and each of the metal members and the corresponding one of the terminals are accommodated in a same one of the receiving holes;

wherein each of the metal members has a fixing portion in a shape of a vertical flat plate and a clamping portion, each of the clamping portions, together with corresponding one of the soldering portions, clamps and fixes corresponding one of solder balls, and a contact area between the clamping portion and the solder ball and a contact area between the soldering portion and the solder ball are at least partially located below a horizontal central surface of the solder ball;

wherein the base of each of the terminals is provided with a vertical surface, and a plate surface of the fixing portion of each of the metal members is attached and soldered to the vertical surface of the base of corresponding one of the terminals using a laser.

8. The electrical connector of claim 7, wherein in each of the terminals, the soldering portion is formed by extending downward from the base, a first arm is formed by bending and extending upward from the base toward a direction away from the vertical surface of the base, a second arm is formed by bending and extending backward from the first arm across the vertical surface of the base, a contact portion is arc-shaped and extends from an end of the second arm to urge upward against the chip module, and the first arm and the clamping portion are located on one side of the vertical surface of the base.

9. The electrical connector of claim 7, wherein a connection portion is formed by bending and horizontally extending from a lower end of the fixing portion, and the clamping portion is formed by bending downward and vertically extending downward from the connection portion.

10. The electrical connector of claim 7, wherein each of the metal members is made of a metal material that cannot be stably soldered to the solder ball.

11. The electrical connector of claim 7, wherein each of the metal members is made of a stainless steel material.

12. The electrical connector of claim 7, wherein each of the metal members further has a connection portion located above corresponding one of the solder balls to stop the solder ball from moving upward, and the clamping portion is formed by bending and extending downward from the connection portion.

13. The electrical connector of claim 1, wherein the base is provided with a vertical surface, each of the solder balls is ball-shaped, and a vertical central surface of each of the solder balls is perpendicular to the vertical surface of the base of corresponding one of the terminals and passes through the soldering portion of the corresponding one of the terminals and the clamping portion of corresponding one of the metal member.

14. The electrical connector of claim 7, wherein each of the solder balls is ball-shaped, and a vertical central surface of each of the solder balls is perpendicular to the vertical surface of the base of corresponding one of the terminals and passes through the soldering portion of the corresponding one of the terminals and the clamping portion of corresponding one of the metal member.

* * * * *